(12) United States Patent
Lee

(10) Patent No.: US 9,396,774 B1
(45) Date of Patent: Jul. 19, 2016

(54) CAS LATENCY SETTING CIRCUIT AND SEMICONDUCTOR MEMORY APPARATUS INCLUDING THE SAME

(71) Applicant: SK hynix Inc., Icheon-si Gyeonggi-do (KR)

(72) Inventor: Seong Jun Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/049,972

(22) Filed: Feb. 22, 2016

Related U.S. Application Data

(62) Division of application No. 13/720,204, filed on Dec. 19, 2012, now Pat. No. 9,299,454.

(30) Foreign Application Priority Data

Aug. 16, 2012 (KR) .......................... 10-2012-0089554

(51) Int. Cl.
 *G11C 7/10* (2006.01)
 *G11C 29/04* (2006.01)
 *G11C 7/22* (2006.01)

(52) U.S. Cl.
 CPC .............. *G11C 7/106* (2013.01); *G11C 7/222* (2013.01); *G11C 29/04* (2013.01)

(58) Field of Classification Search
 None
 See application file for complete search history.

(56) References Cited

U.S. PATENT DOCUMENTS

2012/0173937 A1* 7/2012 Do .......................... G11C 29/48
 714/719

* cited by examiner

*Primary Examiner* — Kretelia Graham
(74) *Attorney, Agent, or Firm* — William Park & Associates Ltd.

(57) ABSTRACT

A semiconductor memory apparatus includes a CAS latency setting circuit configured to change an initially-set CAS latency value in response to control signal pulses which are sequentially applied, during a test mode without changing settings of a mode register set during each test.

8 Claims, 4 Drawing Sheets

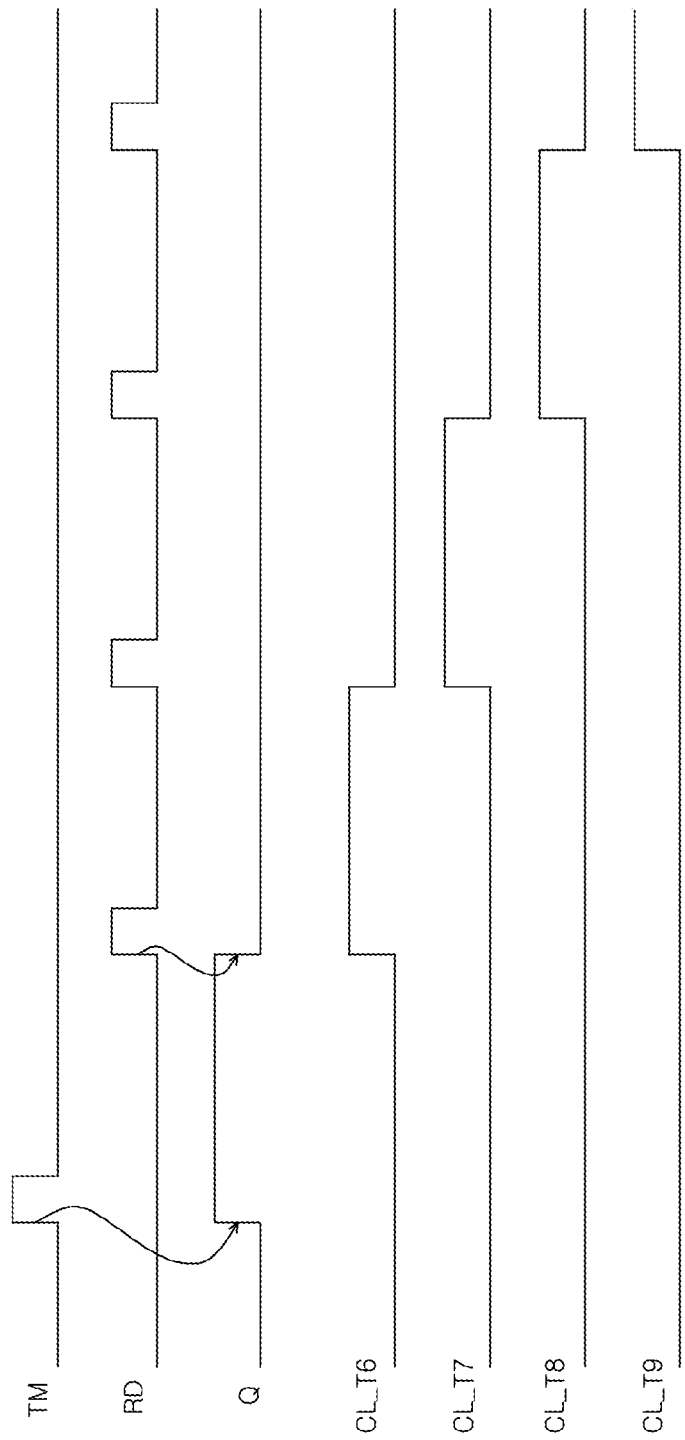

CAS LATENCY SETTING CIRCUIT AND SEMICONDUCTOR MEMORY APPARATUS INCLUDING THE SAME

CROSS-REFERENCES TO RELATED APPLICATION

The present application is a Division of U.S. application Ser. No. 13/720,204, filed on Dec. 19, 2012, and the present application claims priority under 35 U.S.C. §119(a) to Korean application number 10-2012-0089554 filed on Aug. 16, 2012 in the Korean Intellectual Property Office, which is incorporated herein by reference in its entirety.

BACKGROUND

1. Technical Field

The present invention relates generally to semiconductor design technology, and more particularly, to a CAS latency setting circuit for performing a test and a semiconductor memory apparatus including the same.

2. Related Art

Typically, a semiconductor memory apparatus is designed using a synchronous clock in order to improve data transmission speed. For example, when an external command such as a read command is received in synchronization with an external clock, a synchronous DRAM (SDRAM) may output data from a memory cell in synchronization with a clock signal after a predetermined clock cycle from the read command. The time delay from when the clock signal is synchronized with the external command to when the clock signal is synchronized with the output data is referred to as column address strobe (CAS) latency.

In general, CAS latency is set by information bits stored in a mode register set (MRS) inside a semiconductor memory apparatus. For example, referring to FIG. 1, CAS latency may be set according to predetermined address information when a MRS command is inputted. That is, the CAS latency may be arbitrarily set according to the initial setting of the MRS. Accordingly, a synchronous semiconductor memory apparatus outputs read data externally after a time delay corresponding to the CAS latency from a clock signal synchronized with an external read command.

Typically, a system using the synchronous semiconductor memory apparatus sets the CAS latency of the semiconductor memory apparatus to a specified value without modifying the CAS latency thereafter. As illustrated in FIG. 2, the synchronous semiconductor memory apparatus 100A sets a fixed CAS latency during the initial setting, thereby solely controlling output timings of data after a read command is applied.

Referring to FIG. 2, the semiconductor memory apparatus 110A includes a CAS latency setting unit 10, an output enable signal generation unit 40, and an output driver 50.

The CAS latency setting unit 10 is configured to set a CAS latency value CL according to specific address information such as address information A<2,4,5> as illustrated in FIG. 2, when an MRS command is applied. The CAS latency setting unit 10 may include an MRS configured to perform the initial settings of the semiconductor memory apparatus.

The output enable signal generation unit 40 is configured to receive the CAS latency value CL and generate an output enable signal OEFLAG by shifting a read signal pulse RD applied from an external source. The output enable signal OEFLAG is a signal which is activated to output read data externally. When the read signal pulse RD is shifted, a delay amount based on the entire data output path of the semiconductor memory apparatus may be considered to generate the output enable signal at a specified time.

The output driver 50 is configured to output the read data DATA as output data DOUT externally at a time when the output enable signal OEFLAG is activated.

When the CAS latency value CL is set at the initial stage, the conventional synchronous memory apparatus has a data output timing depending on the set CAS latency value CL when the read signal pulse RD is applied. Therefore, data processing may be performed quickly and precisely between the semiconductor memory apparatus and a processor inside the system.

For this reason, the synchronous semiconductor memory apparatus has a fixed CAS latency according to the initial settings. During a production design process, however, the synchronous semiconductor memory apparatus is designed to implement various CAS latency values to operate properly under different system environments.

Therefore, after a synchronous semiconductor memory apparatus is fabricated, testing is conducted to determine whether proper operation under various CAS latency values is achieved. However, it is very inefficient to set various CAS latency values by changing settings of a mode register set during each test. Accordingly, there is a demand for a semiconductor memory apparatus capable of operating at a fixed CAS latency value in a normal mode, and efficiently testing various CAS latency values in a test mode.

SUMMARY

In an embodiment, a semiconductor memory apparatus includes a CAS latency setting circuit configured to change an initially-set CAS latency value in response to control signal pulses which are sequentially applied, during a test mode.

In another embodiment, a CAS latency setting circuit includes: a setting signal generation section configured to activate a setting signal in response to a test mode signal pulse, and deactivate the setting signal in response to a control signal pulse applied at the initial stage among control signal pulses which are sequentially applied; and a counter section configured to receive a pulse of the setting signal generated by the setting signal generation unit, and change an initially-set CAS latency value in response to the control signal pulses.

In another embodiment, a semiconductor memory apparatus includes: a normal CAS latency setting unit configured to set a normal CAS latency value based on mode register set address information; a test CAS latency setting unit configured to change an initially-set test CAS latency value in response to control signal pulses which are sequentially applied, during a test mode; a selection unit configured to selectively output the normal CAS latency value or the test CAS latency value depending on whether the current mode is the test mode or not; and an output enable signal generation unit configured to receive the normal CAS latency value or the test CAS latency value transmitted from the selection unit, and generate an output enable signal by shifting a read signal pulse applied from an external source according to the CAS latency value; and an output driver configured to output read data externally at a time when the output enable signal is activated.

BRIEF DESCRIPTION OF THE DRAWINGS

Features, aspects, and embodiments are described in conjunction with the attached drawings, in which:

FIG. 5 is a waveform diagram illustrating a specific operation of the test CAS latency setting unit of FIG. 4.

DETAILED DESCRIPTION

Hereinafter, a CAS latency setting circuit and a semiconductor memory apparatus including the same according to the present invention will be described below with reference to the accompanying drawings through various embodiments.

Figure 3:
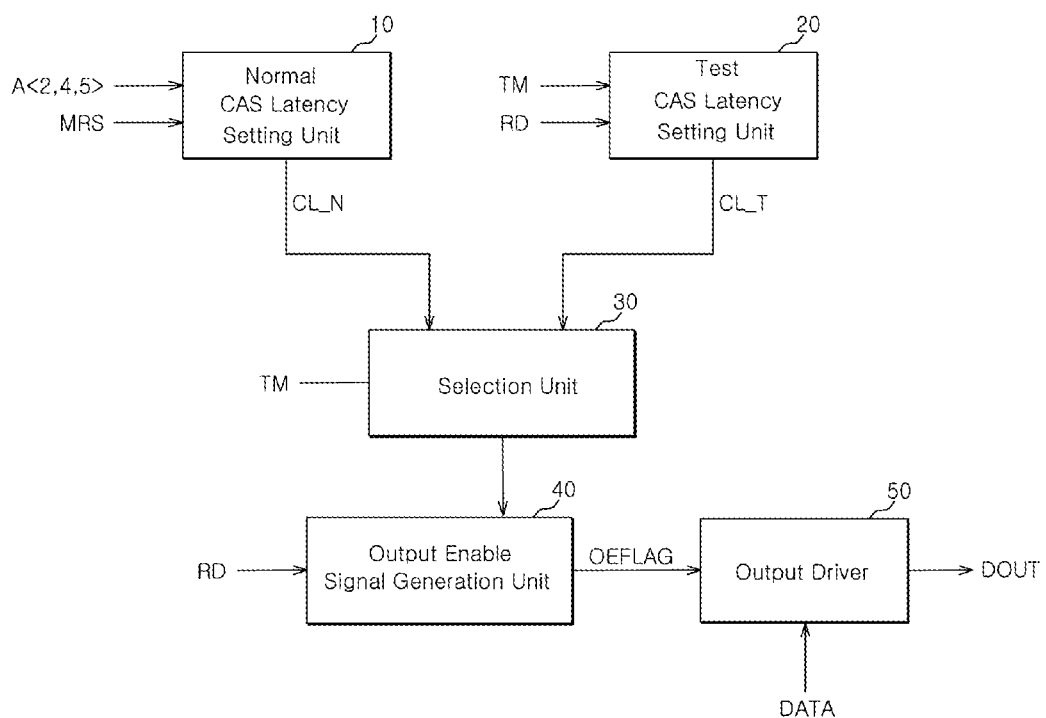
FIG. 3 is a block diagram of a semiconductor memory apparatus according to an embodiment.

FIG. 3 is a block diagram of a semiconductor memory apparatus 100B according to an embodiment.

The design technology of the semiconductor memory apparatus according to an embodiment may be widely applied to various synchronous memory apparatuses as well as SDRAM.

The semiconductor memory apparatus 100B illustrated in FIG. 3 includes a normal CAS latency setting unit 10, a test CAS latency setting unit 20, a selection unit 30, an output enable signal generation unit 40, and an output driver 50.

Figure 1:
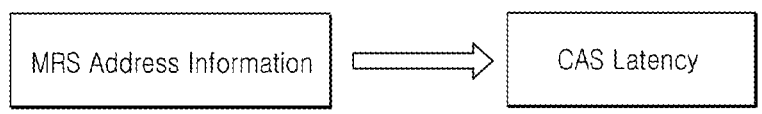
FIG. 1 is a diagram illustrating a conventional CAS latency setting method.
Figure 2:
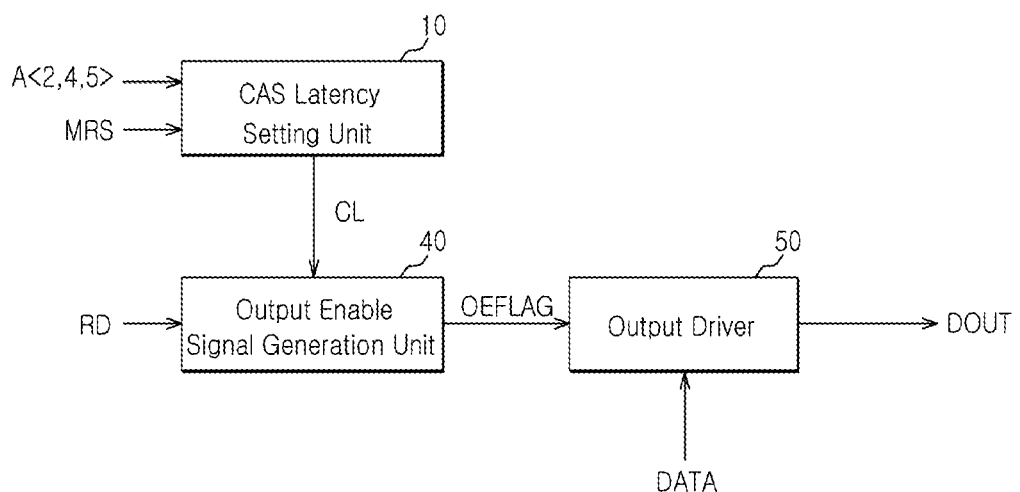
FIG. 2 is a block diagram of a conventional semiconductor memory apparatus.

The normal CAS latency setting unit 10 has a substantially similar configuration as the CAS latency setting unit illustrated in FIG. 2, and is configured to set a normal CAS latency value CL_N according to specific address information such as address information A<2, 4, 5> as illustrated in FIG. 3, when a mode register set (MSR) command is applied. The normal CAS latency setting unit 10 may include an MRS configured to perform the initial settings of the semiconductor memory apparatus.

The test CAS latency setting unit 20 is configured to sequentially increase (or decrease) an initially-set test CAS latency value CL_T in response to control signal pulses which are sequentially applied during a test mode. The test CAS latency setting unit 20 serves to sequentially change the test CAS latency value CL_T, in order to verify the operation of the semiconductor memory apparatus according to various CAS latency values during the test mode. One of the control signal pulses may be implemented with a read signal pulse RD, and the test CAS latency setting unit 20 may include a plurality of flip-flops to sequentially change the test CAS latency value CL_T whenever the read signal pulse RD are sequentially applied.

The selection unit 30 serves to selectively transmit the normal CAS latency value CL_N or the test CAS latency value CL_T, depending on whether or not the current mode is the test mode. Specifically, the selection unit 30 transmits the normal CAS latency CL_N to the output enable signal generation unit during a normal mode. However, when receiving an activated mode signal pulse TM during the test mode, the selection unit 30 transmits the test CAS latency value CL_T to the output enable signal generation unit 40 until the test mode is complete. In an embodiment, the selection unit 30 may include a plurality of pass gates to select a transmission path of a signal.

The output enable signal generation unit 40 is configured to receive the normal CAS latency value CL_N or the test CAS latency value CL_T transmitted from the selection unit 30, and generate an output enable signal OEFLAG by shifting a read signal pulse RD applied from an external source according to the CAS latency. The read signal pulse RD is a read command applied from an external source, and the output enable signal OEFLAG is a signal activated to output read data externally. When the read signal pulse RD is shifted, a delay amount based on the entire data output path of the semiconductor memory apparatus may be considered to generate the output enable signal at a specified time. The output enable signal generation unit 40 has a substantially similar configuration as the output enable signal generation unit of FIG. 2.

The output driver 50 outputs the read data DATA as output data DOUT externally at a time when the output enable signal OEFLAG is activated. The output driver 50 has a substantially similar configuration as the output driver of FIG. 2.

The overall operations of the semiconductor memory apparatus 100B according to an embodiment will be described as follows.

First, during the initial setting of the mode register set, the normal CAS latency setting unit 10 sets a normal CAS latency CL_N. The normal CAS latency CL_N is a CAS latency value indicating a data output timing after a read command is applied from an outside source during a normal operation.

During the test mode, the test CAS latency setting unit 20 provides the test CAS latency CL_T which may sequentially increase or decrease. Accordingly, during the test mode, the operation of the semiconductor memory apparatus based on various CAS latency values may be tested.

The selection unit 30 provides the normal CAS latency CL_N or the test CAS latency CL_T to the output enable signal generation unit 40, depending on whether the current mode is in test mode. The output enable signal generation unit 40 shifts the read signal pulse RD according to the provided CAS latency CL_N or CL_T, thereby indicating an activation timing of the output enable signal OEFLAG. The output driver 50 outputs the read data DATA externally in response to the output enable signal OEFLAG.

Therefore, after the read command is applied, the semiconductor memory apparatus 100B may transmit output data DOUT externally after a clock cycle corresponding to the CAS latency.

Figure 4:
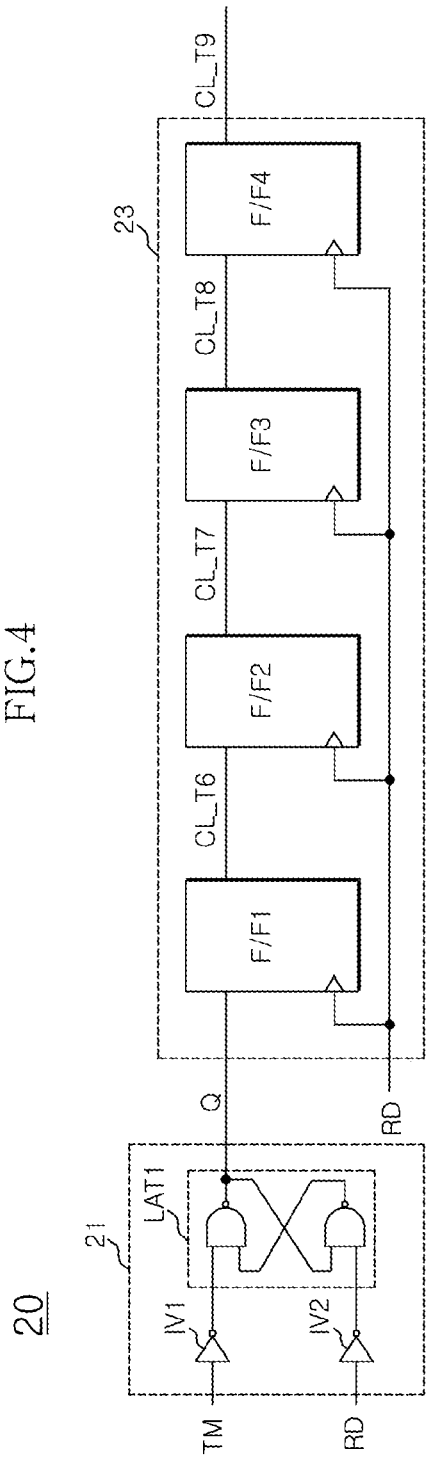
FIG. 4 is a circuit diagram illustrating the test CAS latency setting unit of FIG. 3.

FIG. 4 is a circuit diagram illustrating an embodiment of the test CAS latency setting unit 20.

The test CAS latency setting unit 20 includes a setting signal generation section 21 and a counter section 23.

The setting signal generation section 21 is configured to activate a setting signal Q in response to a test mode signal pulse TM, and deactivate the setting signal Q in response to a control signal pulse applied at the initial stage, among control signal pulses which are sequentially applied.

The counter section 23 is configured to receive the setting signal Q generated by the setting signal generation section 21, and sequentially increase or decrease the initially-set test CAS latency value CL_T in response to the control signal pulses which are sequentially applied.

The read signal pulse RD applied from an outside source may be used as the control signal pulse. That is, the semiconductor memory apparatus according to an embodiment may sequentially change the test CAS latency CL_T in response to the read signal pulse which are sequentially applied during the test mode, and generate the output enable signal OEFLAG by shifting the corresponding read signal pulse RD according to the corresponding test CAS latency CL_T.

The setting signal generation section 21 includes first and second inverters IV1 and IV2 and a first latch LAT1.

The first inverter IV1 is configured to invert the test mode signal pulse TM.

The second inverter IV2 is configured to invert the read signal pulse RD.

The first latch LAT1 is a latch circuit including two NAND gates, and is configured to receive outputs of the first and second inverters IV1 and IV and generate the setting signal Q.

It will be easily understood by those skilled in the art that the latch circuit may be implemented with NOR gates.

The counter section 23 includes a plurality of flip flops F/F1 to F/F4 connected in series.

The plurality of flip flops F/F1 to F/F4 is configured to sequentially change the setting signal Q in response to the read signal pulse RD which are sequentially applied. Accordingly, the initially-set test CAS latency value CL_T may be sequentially increased or decreased.

FIG. 4 illustrates four flip-flops F/F1 to F/F4, but the present invention is not limited to four, and may be generally described to include one or more flip-flops.

The operation of the counter section 23 illustrated in FIG. 4 will be described in detail as follows.

Among the plurality of flip-flops, the first flip-flop F/F1 is configured to receive the setting signal Q in response to the read signal pulse RD and generate a first CAS test latency value CL_T6.

The second flip-flop F/F2 is configured to receive the first test CAS latency value CL_T6 and generate a second CAS test latency value CL_T7 in response to the read signal pulse RD.

The third flip-flop F/F3 is configured to receive the second test CAS latency value CL_T7 and generate a third test CAS latency value CL_T8 in response to the read signal pulse RD.

The fourth flip-flop F/F4 is configured to receive the third test CAS latency value CL_T8 and generate a fourth test CAS latency value CL_T9 in response to the read signal pulse RD.

FIG. 5 is a waveform diagram illustrating a specific operation of the test CAS latency setting unit 20.

In FIG. 5, suppose that the counter section 23 stores five as the initial test CAS latency value CL_T.

First, when the semiconductor memory apparatus 100B according to an embodiment enters the test mode, the setting signal generation section 21 generates the setting signal Q in response to the test mode signal pulse TM and the initial read signal pulse RD.

The first flip-flop F/F1 receives the setting signal Q and activates the first test CAS latency CL_T6 in response to the read signal pulse RD. The value of the first test CAS latency CL_T6 may be decoded as six, increased by one from the initial test CAS latency value CL_T.

The second flip-flop F/F2 receives the first test CAS latency CL_T6 and activates the second test CAS latency CL_T7 in response to the read signal pulse RD. The value of the second test CAS latency CL_T7 may be decoded as seven, increased by one from the first test CAS latency CL_T6.

The third flip-flop F/F3 receives the second test CAS latency CL_T7 and activates the third test CAS latency CL_T8 in response to the read signal pulse RD. The value of the third test CAS latency CL_T8 may be decoded as eight, increased by one from the second test CAS latency CL_T7.

The fourth flip-flop F/F4 receives the third test CAS latency CL_T8 and activates the fourth test CAS latency CL_T9 in response to the read signal pulse RD. The value of the fourth test CAS latency CL_T9 may be decoded as nine, increased by one from the third test CAS latency CL_T8.

According to an embodiment, the test CAS latency setting unit 20 may sequentially change the test CAS latency whenever the read command is applied from an outside source during the test mode. Therefore, the semiconductor memory apparatus 100B according to an embodiment may test the operation thereof depending on various CAS latency values during the test mode.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
    a normal CAS latency setting unit configured to set a normal CAS latency value based on mode register set address information;
    a test CAS latency setting unit configured to change an initially-set test CAS latency value in response to control signal pulses which are sequentially applied, during a test mode;
    a selection unit configured to selectively output the normal CAS latency value or the test CAS latency value depending on whether the current mode is in test mode;
    an output enable signal generation unit configured to receive the normal CAS latency value or the test CAS latency value transmitted from the selection unit, and generate an output enable signal by shifting a read signal pulse applied from an outside source according to the CAS latency value; and
    an output driver configured to output read data externally at a time when the output enable signal is activated.

2. The semiconductor memory apparatus according to claim 1, wherein the test CAS latency setting unit comprises:
    a setting signal generation section configured to activate a setting signal in response to a test mode signal pulse, and deactivate the setting signal in response to a control signal pulse applied at the initial stage among control signal pulses which are sequentially applied; and
    a counter section configured to receive a pulse of the setting signal generated by the setting signal generation unit, and then change an initially-set CAS latency value in response to the control signal pulses which are sequentially applied.

3. The semiconductor memory apparatus according to claim 2, wherein the control signal pulses comprise the read signal pulse applied from an outside source.

4. The semiconductor memory apparatus according to claim 3, wherein the setting signal generation section comprises a latch configured to receive an inverted test mode signal pulse and an inverted read signal pulse, and output the setting signal.

5. The semiconductor memory apparatus according to claim 3, wherein the counter section comprises a plurality of flip-flops that sequentially change the setting signal in response to the read signal pulse which are sequentially applied, thereby sequentially increasing or decreasing the initially-set test CAS latency value.

6. The semiconductor memory apparatus according to claim 5, wherein a first flip-flop among the plurality of flip-flops is configured to receive the setting signal and activate a first CAS latency value in response the read signal pulse, and
    a second flip-flop among the plurality of flip-flops is configured to receive the first CAS latency value and activate a second CAS latency value in response to the read signal pulse.

7. The semiconductor memory apparatus according to claim 1, wherein the selection unit transmits the normal CAS latency value to the output enable signal generation unit during a normal mode, and transmits the test CAS latency value to the output enable signal generation unit during the test mode.

8. The semiconductor memory apparatus according to claim 1, wherein the selection unit includes a plurality of pass gates to select a transmission path of a signal.

* * * * *